United States Patent
Hauschild

(10) Patent No.: US 6,384,981 B1
(45) Date of Patent: May 7, 2002

(54) OPTICAL EMITTER ARRAY WITH COLLIMATING OPTICS UNIT

(75) Inventor: Dirk Hauschild, Dortmund (DE)

(73) Assignees: Joachim Hentze; Vitalij Lissotschenko, both of (DE)

( * ) Notice: Subject to any disclaimer, the term of this patent is extended or adjusted under 35 U.S.C. 154(b) by 0 days.

(21) Appl. No.: 09/699,986

(22) Filed: Oct. 26, 2000

Related U.S. Application Data

(63) Continuation of application No. PCT/EP99/02944, filed on Apr. 30, 1999.

Foreign Application Priority Data

Apr. 30, 1998 (DE) .......................................... 198 19 333

(51) Int. Cl.[7] .......................... G02B 27/10; G02B 27/30
(52) U.S. Cl. ...................................... 359/622; 623/641
(58) Field of Search .................................. 359/621, 622, 359/623, 630, 641, 624, 625, 719; 250/578.1, 235

(56) References Cited

U.S. PATENT DOCUMENTS

| | | | | |
|---|---|---|---|---|
| 5,541,951 A | * | 7/1996 | Juhasz | 372/101 |
| 5,592,333 A | * | 1/1997 | Lewis | 359/628 |
| 6,137,633 A | * | 10/2000 | Tanaka | 359/619 |
| 6,222,864 B1 | * | 4/2001 | Waarts et al. | 372/43 |
| 6,310,727 B1 | * | 10/2001 | Tanaka | 359/624 |

\* cited by examiner

*Primary Examiner*—Loha Ben
*Assistant Examiner*—Saeed Seyrafi
(74) *Attorney, Agent, or Firm*—Hoffman, Wasson & Gitler

(57) ABSTRACT

An optical emitter array with collimation optics in which a number of extended emitters are arranged side-by-side in the x-direction, having a specified divergence ($\alpha_x$) in this direction and a center-to-center separation ($P_x$) greater than the emitter size ($E_x$) and in which the collimation optics include a cylindrical lens array with a number of convergent cylindrical-lens surfaces each assigned to an emitter and having its cylindrical axis lying in the y-direction, arranged in front of the emitter array, characterized in that a first cylindrical-lens array with focal length ($F_A$) is positioned in front of the emitters within an overlap distance (a) at which the ray bundles emerging from the emitters overlap at a separation (c) that is small in comparison to said focal length $F_A$, a second cylindrical-lens array having the same focal length ($F_A$) is positioned with a telescopic arrangement at a distance of this focal length ($F_A$) away from the first cylindrical-lens array.

16 Claims, 6 Drawing Sheets

OPTICAL EMITTER ARRAY WITH COLLIMATING OPTICS UNIT

CLAIM OF PRIORITY

Figure 1:
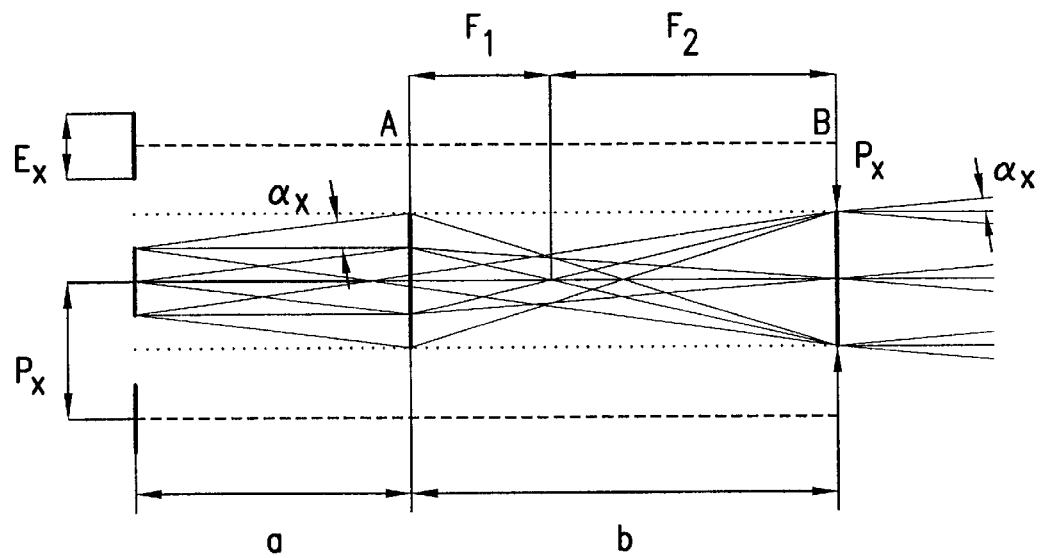

The present application claims priority to German Application No.198 19 333.5 filed Apr. 30, 1998 and a continuation to PCT Application No. PCT/EP99/02944 Apr. 30, 1999 and are hereby incorporated in entirety by reference.

FIELD OF THE INVENTION

The invention concerns an optical emitter array with collimation optics in which a number of extended emitters are arranged side-by-side in the x-direction, with a specified divergence $\alpha_x$ in this direction and a center-to-center separation ($P_x$) greater than the emitter size $E_x$ and in which the collimation optics include a cylindrical lens array with a number of convergent cylindrical-lens surfaces each assigned to an emitter and having its cylindrical axis lying in the y-direction, arranged in front of the emitter array.

PRIOR ART

Such emitter arrays, with a number of optical sources that are linearly extended in the x-direction of width ($E_x$) running along the x-axis in the shape of a linear matrix with center-to-center distance ($P_x$) appear, for example, in high-power diode laser bars. The combined width of these laser bars lies in the range of a few millimeters. For concrete applications, it is generally necessary to subject these discontinuous beam profiles formed from separate linear sections to a beam shaping such as a homogenization or a geometric cross-section transformation. The first step in this beam preparation is generally collimation, the goal of which is to achieve the greatest possible degree of divergence reduction over the entire active beam cross-section.

The collimation must take into account the strongly anisotropic divergence distribution of semiconductor lasers. Specifically, the divergence angle $\alpha_y$ in the y-direction ("fast-axis") is relatively large while the divergence angle $\alpha_x$ in the x-direction ("slow-axis") is comparatively small. This situation is handled by using cylindrical lenses to produce parallel rays in the different coordinates. For a laser bar with a number of emission centers, the fast-axis collimation is carried out by a single cylindrical lens lying in the x-direction and, because of the large divergence, positioned as closely as possible in front of the emitter array. For collimation along the slow-axis, a cylindrical-lens array is employed in which a cylindrical lens, whose width corresponds to the center-to-center distance ($P_x$) of the emitter, is placed in front of each respective emitter in the beam direction.

A good collimation in the x-direction is fundamentally possible when the focal length (F) of the cylindrical-lens array is as large as possible relative to the emitter width ($E_x$). This, however, leads to a large overall length, which is particularly disadvantageous for micro-optic components and is therefore undesirable. This procedure has the additional disadvantage that ray bundles emerging from the emitters overlap one another in the x-direction at a distance (a) in front of the emitter surfaces and, as a result, a separate divergence reduction for individual emitters is no longer possible.

For a separate collimation of the individual emitters, a cylinder-lens array can of course be positioned within the overlap distance, a. From fundamental considerations, a divergence reduction under the assumption of smaller divergence in the slow-axis is only possible when the ratio of emitter size to center-to-center distance, $E_x/P_x<0.5$, holds. For high-power diode laser bars, however, generally $E_x/P_x \geq 0.5$ so that a separate collimation with a single cylindrical-lens array is fundamentally impossible.

An additional problem is that the beam cross-section still has a discontinuous energy distribution and so the high brightness of the emitter array is of only limited utility due to the great inhomogeneity.

SUMMARY OF THE INVENTION

Based on the problems illustrated above, the task of the invention is to provide an optical emitter array, in particular some laser bars, with collimation optics, which delivers a better beam quality, especially with regard to parallelism and homogeneity, while having a smaller overall length.

For solving this task, the invention proposes that a first cylindrical-lens array with focal length ($F_1$) be positioned within the overlap distance (a) in front of the emitters at which the individual ray bundles emerging from the emitters overlap, in which the focal length ($F_1$) is smaller then the overlap distance (a) and that a second cylindrical-lens array with focal length ($F_2$) be positioned in a telescopic arrangement at a distance ($b=F_1+F_2$) in front of the first spherical-lens array.

According to the invention, the first and second cylindrical-lens arrays form an optical telescope whose eyepiece side is directed toward the emitter. Since the first cylindrical-lens array located there is maximally at the overlap distance (a) the overall result is a very short total length.

Since the front end of the collimation optics is located within the overlap distance (a), a separate collimation of each individual emitter is possible. The particular advantage of the invention consists in that an effective divergence reduction results nonetheless, even when $E_x/P_x \geq 0.5$.

This advantage of the collimator-telescope arrangement according to the invention has to do with the fact that the first cylindrical-lens array produces a virtual magnification in an image plane of the emitter with width ($E_x$) to the width of the center-to-center distance ($P_x$). This becomes the effective source size for the second cylindrical-lens array. Because of the constant beam-parameter product according to the Lagrange invariant (aperture x sine (divergence)=constant), the result is a divergence reduction by a factor of the magnification, M, of the telescopic arrangement. The approximation is valid for small angles, which is, however, no problem for the small divergence along the slow-axis.

A further essential advantage of the collimation optics according to the invention consists in that, by magnifying the sources to the center-to-center distance ($P_x$), a continuously linear beam cross-section is produced in the x-direction. For a given emitter array, a high brightness is thereby produced. The homogeneous intensity distribution is particularly advantageous as an input beam for subsequent beam transformation devices.

For this embodiment of the invention, the overlap distance (a) observes the relation:

$$a \leq \frac{(P_x - E_x)}{2\tan(\alpha_x)}.$$

In this formula, $\alpha_x$ is the divergence in the x-direction. For the focal length ($F_1$) of the first cylindrical-tens array, the following value is set:

$$F_1 = \frac{a}{\frac{E_r}{p_r} + 1}.$$

Based on this value, the focal length ($F_2$) of the second cylindrical-lens array is calculated as:

$$F_2 = F_1 \frac{P_r}{E_r}.$$

With the formulas described above, a cylindrical-lens collimator with two successive cylindrical-lens arrays that together form an imaging telescope is described for the first time.

The collimation efficiencies of the embodiment of the invention with an imaging-telescope arrangement mentioned above, can alternatively be realized by a telescopic arrangement with Fourier transform and field lens in which a first cylindrical-lens array (A) is positioned in front of the emitter (E) at a distance ($z_1$) that is smaller then the overlap distance (a) at which the individual beams emerging from the emitter (E) overlap and a second cylindrical-lens array (B) is positioned at a distance (T) in front of the cylindrical-lens array (A) whereby the arrays (A and B respectively) together form a biconvex lens with resultant focal length ($F_r=F_A$) and principal-plane distance ($T=F_A$).

For the collimation, the same requirement holds with respect to the distance to the first cylindrical-lens array (A) as before with the imaging-telescope arrangement, namely, that ray bundles emerging from neighboring emitters (E) must not overlap.

In contrast to the first variant of the invention, however, no image results from the first cylindrical-lens array (A) but rather a Fourier transformation. The second cylindrical-lens array (B) has, in this arrangement, the function of a field lens.

This embodiment starts with the assumption that the maximal focal length ($F_A$) can only be theoretically reached when $E_x=0$. In fact, however, the emitters (E) should be considered as extended sources that must obey $0<z_1<F_A$ in order to fulfill the requirement that beams emerging from neighboring emitters do not overlap in front of the collimation optics. According to the present embodiment of the invention, this is achieved in that the collimation as a whole results from a biconvex lens with the resultant focal length ($F_r$) whose principal-plane distance is $T=F_A/n$ (with n=1 for air). In this configuration, the second lens (B) serves as field lens.

From the correlation for two thin lenses with focal lengths ($F_A$ and $F_B$) the resultant focal length ($F_r$) of the collimation system observes the relation:

$$F_r = \frac{(F_A F_B)}{F_A + F_B - \frac{T}{n}},$$

for $T/n=F_A$, the result is: $F_r=F_A$.
In addition, for $T/n=F_A$:

$$z_1 = F_A \left[1 - \frac{F_A}{F_B}\right] \quad \text{or} \quad \frac{1}{F_B} = \frac{1}{F_A} - \frac{z_1}{F_A^2}.$$

With the resultant focal length ($F_r$) one then has a flexibly adjustable distance ($z_1$) between the emitter (E) and the first cylindrical-lens array (A). The focal length ($F_B$) of the second array (B), which serves as a field lens, compensates for this in accordance with the preceding relation.

In the just-mentioned biconvex lens arrangement, the first lens surface, which is formed by the first cylindrical-lens array (A) is responsible for the Fourier transformation of the ray bundle. The second lens surface, which is formed by the second cylindrical-lens array (B), contributes, as a field lens, to a narrowing of the emission angle.

Under certain conditions, when the individual emitters (E) of the emitter arrays are very small in the x-direction, it is useful, in regards to delivering the best brightness possible, to first reduce the divergence along the fast-axis, i.e. in the y-direction, and afterwards to collimate the slow-axis. This can be achieved according to the invention by locating between the emitters (E) and the cylindrical-lens array (A) a cylindrical-lens surface (C) whose cylindrical axis lies in the x-direction, i.e. parallel to the longitudinal axis of the emitter (E). In this way, since the first cylindrical-lens array (A) and the third cylindrical-lens surface (C) are combined into a monolithic component, the result is an advantageously small number of lens interfaces.

In order to eliminate residual divergence in the y-direction, i.e. along the fast-axis, a fourth cylindrical-lens surface, whose cylindrical axis lies in the x-direction, can be positioned between the first cylindrical-lens array (A) and the second cylindrical-lens array (B). This produces the same advantages as those already described above for the cylindrical-lens array (A) and the cylindrical lens (C). It is likewise useful to combine the second cylindrical-lens array (B) and the fourth cylindrical-lens surface (D) into a monolithic component.

Starting from the same fundamental problem, the invention presents an alternative embodiment, which likewise has two successive cylindrical-lens arrays for slow-axis collimation but which are, in contrast, optically divergent. In particular, it is envisioned here that a first cylindrical-lens array with focal length ($F_A$) is positioned in front of the emitters at a distance (c) that is small relative to $F_A$ and a second cylindrical-lens array with the same focal length ($F_A$) at a distance of this focal length ($F_A$) from the first cylindrical-lens array.

In this embodiment of the invention, it is a matter of a Fourier arrangement in which no imaging results as with conventional telescopes. Here, the first cylindrical-lens array generates, in an intermediate plane, a source for the second cylindrical-lens array whose size, depending on the Fourier transformation, is dependent on the divergence of the original source, that is, the emitters of the laser bars.

This arrangement, which one can call a cylindrical-lens Fourier telescope, is just as effective, with respect to collimation, as the first-mentioned classic telescope arrangement. In addition, particular advantages arise for small emitter sizes ($E_x$) and short distances ($P_x$). For these cases, the overlap distance (a) is sometimes so small that the overlapping in the slow-axis already occurs in the, generally intermediate, collimation cylindrical lens for the fast-axis. Fundamentally, this problem can be solved by making the fast-axis collimation lens smaller. By shrinking the aperture as well as the focal length, the divergence of the collimated ray bundles would, however, increase as a result in the direction of the fast-axis (y-direction). Here, the Fourier telescope arrangement offers the advantageous possibility, by shortening the distance (c), of moving the first slow-axis cylindrical-lens array according to the invention very close, theoretically down to 0 distance, to the emitters without having to accept a worsening of the collimation effect. This produces, in the first place, an extremely compact design. In addition, the possibility still remains, with an appropriate positioning of a y-cylindrical lens, to maintain good collimation in this direction.

In the cylindrical-lens Fourier telescope, one applies for the focal length ($F_A$):

$$F_A = \frac{P_x}{2\tan\alpha_x}.$$

The cylindrical-lens arrays are preferably of one-piece construction. This holds as much for the telescope as well as for the Fourier arrangement. In particular, the first and second cylindrical-lens arrays can each be of one-piece construction. In addition, one can imagine bringing the optically active cylindrical-lens surfaces of the first and second cylindrical-lens arrays together into one monolithic optical component.

A preferred embodiment of the invention allows for arranging a cylindrical lens, whose cylindrical axis lies in the y-direction, in front of the emitter array as fast-axis collimator. This fast-axis collimator can, at the same time, have the form of an array and, as the case may be, once again be constructed in one piece with the first and/or second cylindrical-lens array. In this context, an advantageous embodiment envisions, for example, that a first monolithic optical element has the cylindrical-lens surface of the first cylindrical-lens array on its side facing the emitters for x-collimation and, on its other side, has a cylindrical-lens surface directed in the y-direction for collimation in that direction. A second x-cylindrical-lens array can then be positioned at the focal-length distance ($F_A$). The result is an extremely compact design for x-y-collimation optics in which the x-divergence reduction results from a Fourier-telescope arrangement according to the invention.

Preferably, the cylindrical lenses have an aspherical form. The imaging quality in the intermediate plane is improved in that the resulting divergence is significantly reduced. As a result, the width of the ray bundle does not exceed the maximal aperture ($P_x$).

With the devices according to the invention, the fundamentally new collimation method according to the invention can be adapted for application to emitter arrays, preferably high-power diode laser bars, for which $E_x/P_x$ is frequently greater than or equal to 0.5. This method envisions that, by means of a first cylindrical-lens array, the ray bundle of width ($E_x$) for each individual emitter is broadened to the center-to-center distance ($P_x$) whereby a virtual source of width ($P_x$) is generated in the intermediate plane of the second cylindrical-lens array. The particular advantage of this method according to the invention consists in that a separate collimation is carried out for each individual emitter. For this purpose, collimation arrangements, such as those presented as examples above, are inserted in front of the emitters within the overlapping distance at which the ray bundles begin to overlap because of their divergence. An alternative for this is that the first and second cylindrical-lens arrays are arranged in telescope configuration, that is to say, at a distance ($b=F_1+F_2$) which is the sum of their focal lengths, or in Fourier configuration whereby both cylindrical-lens arrays with common focal length ($F_A$) are located at the focal-length distance ($F_A$).

The method according to the invention overcomes the limitations that arise in principle from the application of separate cylindrical-lens arrays for each divergence direction, common until now.

DETAILED DESCRIPTION OF THE DRAWINGS

Figure 2:
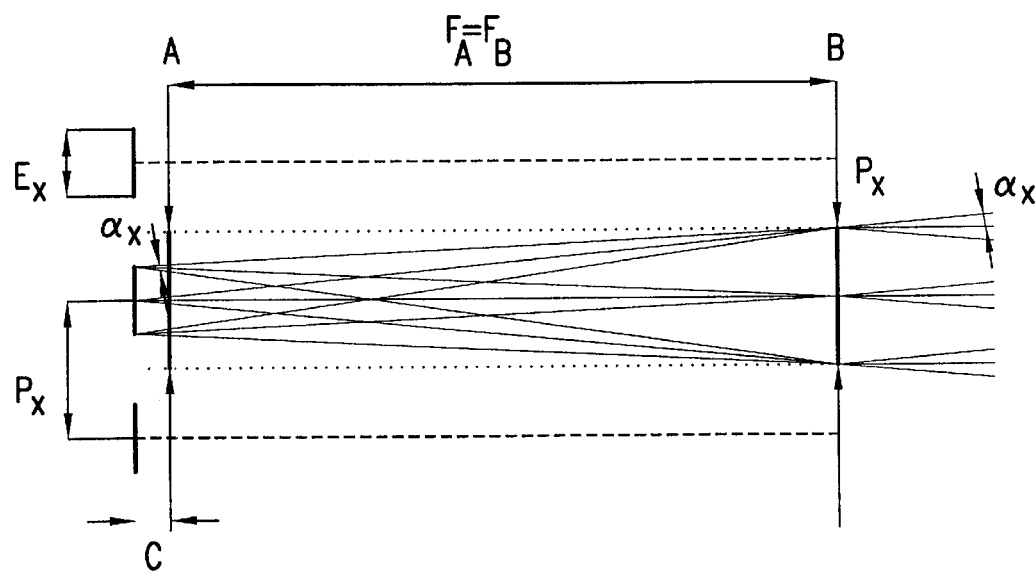
Figure 3:
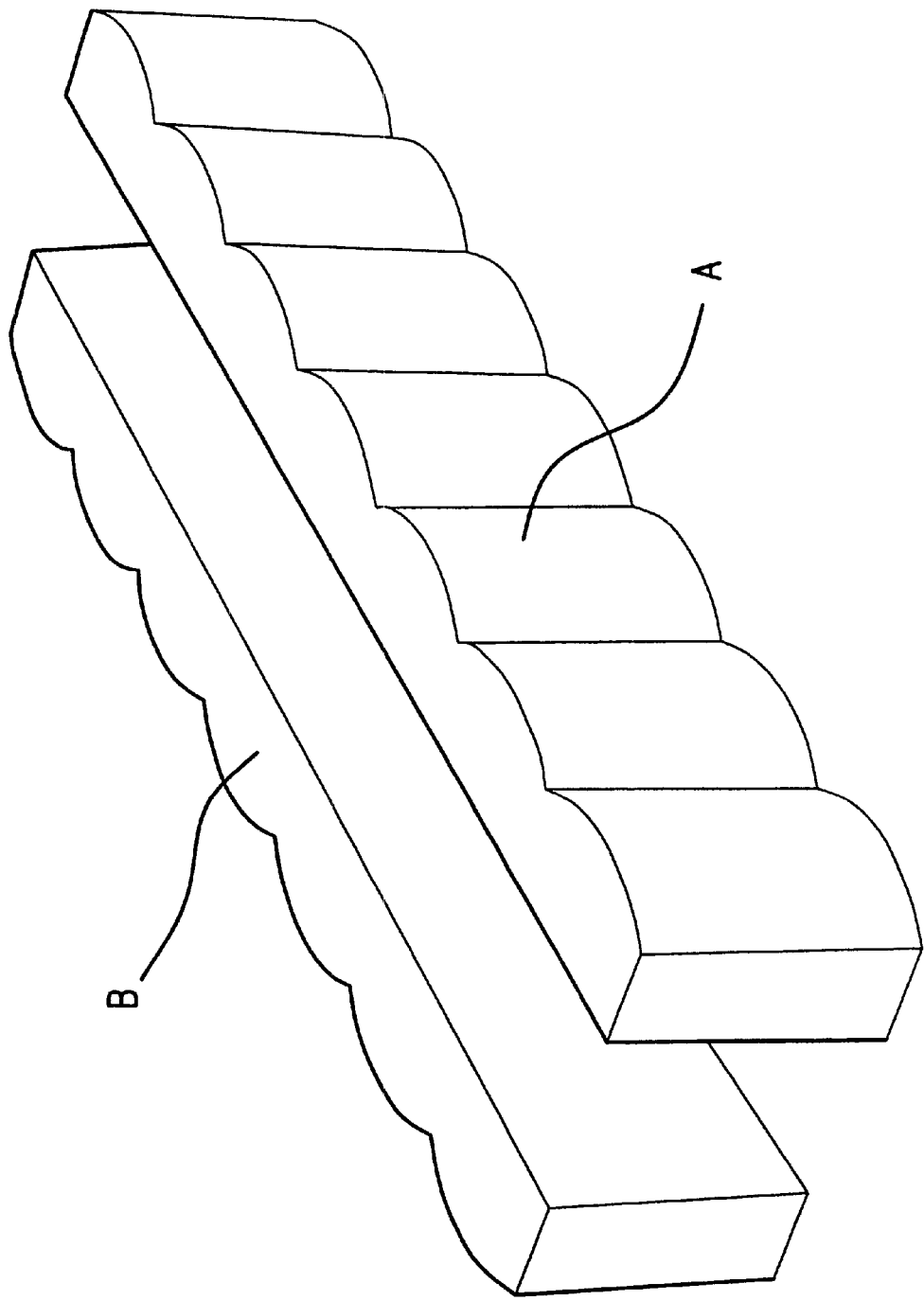
Figure 3A:
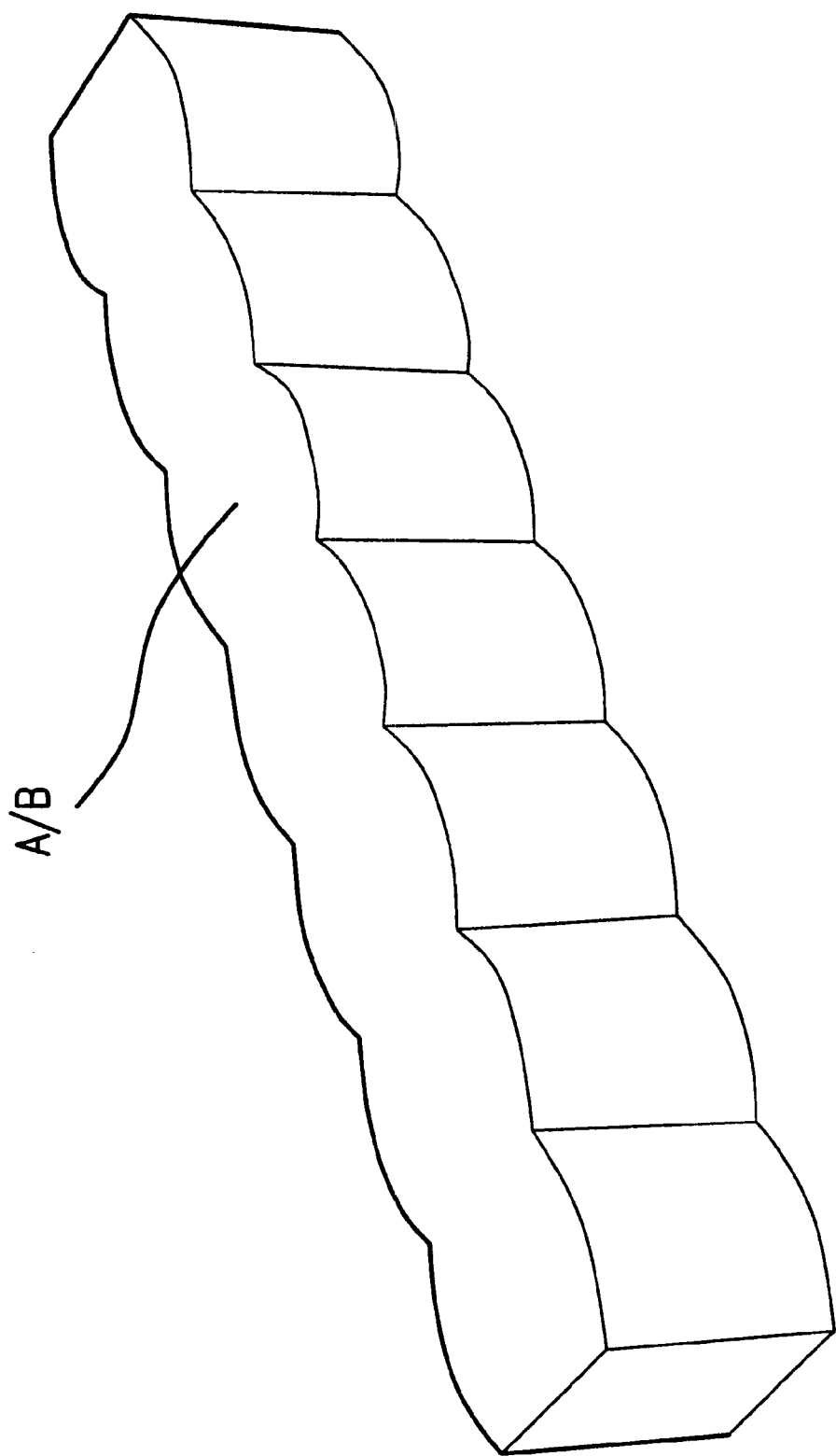
Figure 4:
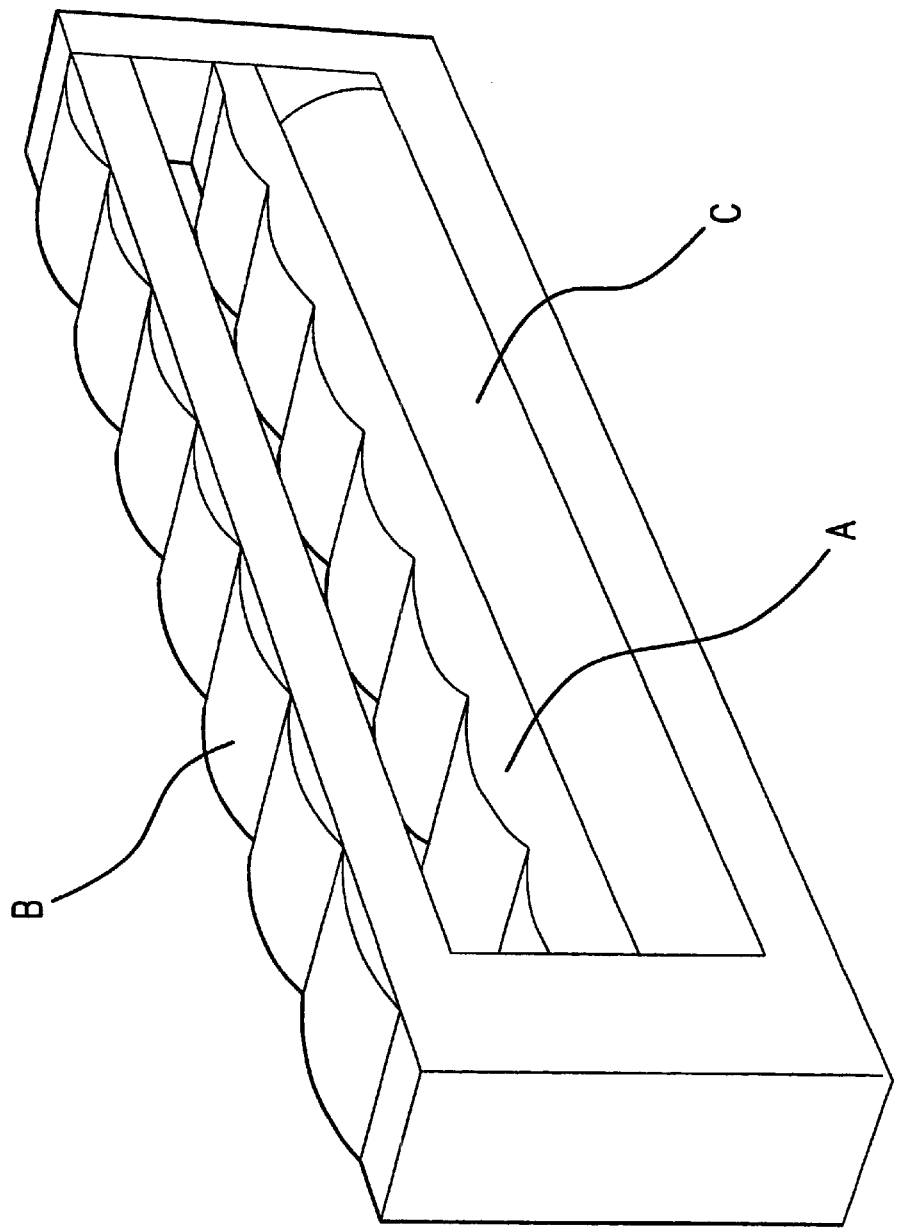
Figure 5:
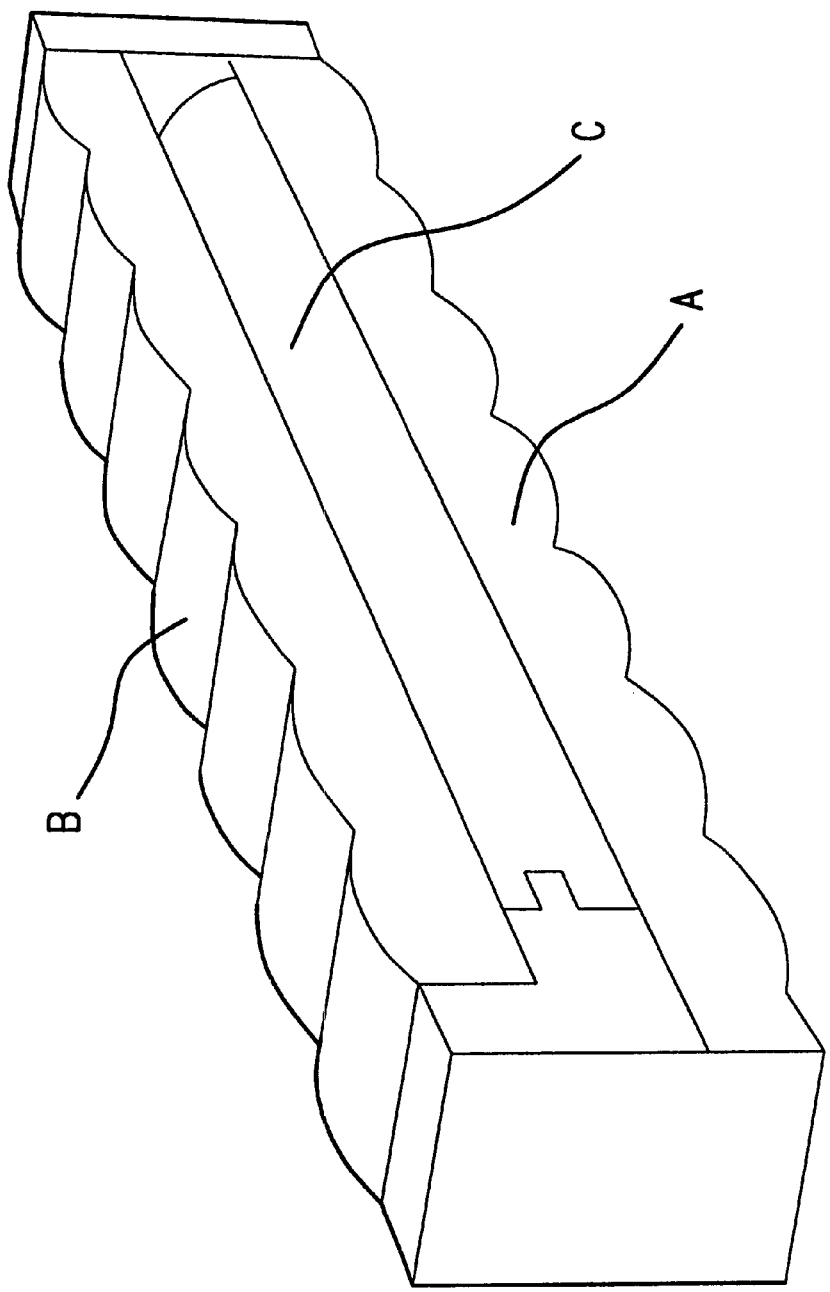
Figure 6:
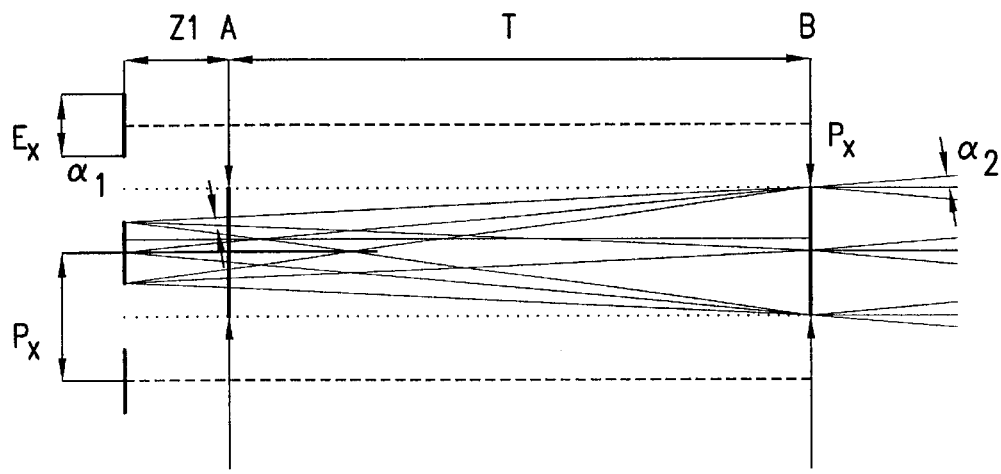
Figure 7A:
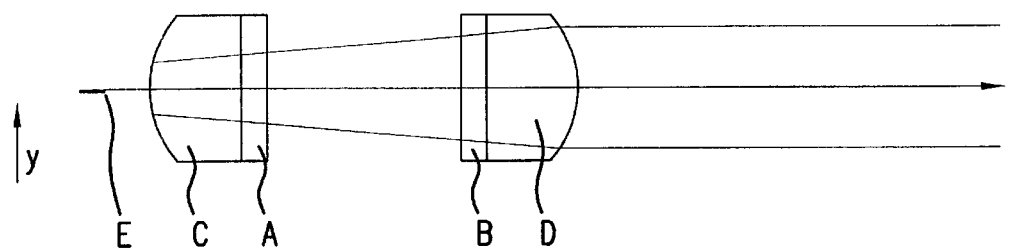

Embodiments of the invention are more clearly illustrated in the following with the use of figures:

FIG. 1 the ray paths for an emitter array with collimation optics according to the invention in a first embodiment;

FIG. 2 the ray paths for an emitter array with collimation optics according to the invention in a second embodiment;

FIG. 3 a perspective view of collimation optics arranged according to the invention for slow-axis collimation;

FIG. 3a collimation optics as in FIG. 3 in a further embodiment;

FIG. 4 a perspective view of collimation optics arranged according to the invention for fast- and slow-axis collimation;

FIG. 5 a perspective view of collimation optics arranged according to the invention for fast- and slow-axis collimation in a second embodiment;

FIG. 6 the ray paths for an emitter array with collimation optics according to the invention in a third embodiment;

FIGS. 7a/b schematic of the ray paths for an emitter array with collimation optics according to the invention in a fourth embodiment.

DETAILED DESCRIPTION OF A PREFERRED EMBODIMENT

In FIG. 1, a view in the y-axis direction is presented of an emitter array with a number of extended emission surfaces in the form of lines extending in the x-direction having width ($E_x$) and center-to-center distance ($P_x$). This is the typical situation for diode laser bars where frequently $E_x/P_x \geq 0.5$.

The divergence in the x-direction, that is, along the slow-axis, is designated by $\alpha_x$. Due to this divergence, the ray bundles, if they were to spread unhindered, begin to overlap at the overlapping distance (a).

At the distance (a), a first cylindrical-lens array (A) is positioned whose parallel oriented cylindrical-lens surfaces lie in the y-direction and have width ($P_x$). The focal length of the array (A) is ($F_1$).

A second cylindrical-lens array (B) with focal length ($F_2$) is positioned at a distance ($b=F_1+F_2$) from the first cylindrical-lens arrays (A) wherein it constitutes an imaging plane for (A) with respect to the emitter (E). In this way, a classic telescope arrangement is presented.

The collimated output ray bundle has a reduced divergence ($\alpha'_x$).

FIG. 2 shows a Fourier-telescope arrangement in which the first cylindrical-lens array (A) with focal length ($F_A$) is positioned directly in front of the emitters, that is, the distance (c) is small relative to the overlapping distance (a) and to the focal length ($F_A$).

The second cylindrical-lens array (B) with the same focal length ($F_B=F_A$) is positioned at this distance from the first cylindrical-lens array (A) whereby a Fourier arrangement is realized. In other words, the cylindrical-lens array (B) is located in an intermediate plane of the telescope.

With this arrangement, a divergence reduction from $\alpha_x$ to $\alpha'_x$ likewise occurs.

FIG. 3 shows, in a perspective view, the arrangement according to the invention of two cylindrical-lens arrays (A and B) according to FIG. 1 or FIG. 2. Collimation in the fast-axis (x-direction) can be carried out with this.

The embodiment represented in FIG. 3a differs from the collimator device according to FIG. 3 in that both cylindrical-lens arrays (A and B) are combined in one monolithic block (A/B). With this, two optical interfaces, which are p resent for a separate arrangement, are advantageously omitted.

In FIG. 4, a complete fast- and slow-axis collimation device is presented. A cylindrical lens (C), whose axis lies in the y-direction, is here placed in front of the first cylindrical-lens array (A) for fast-axis collimation. Both cylindrical-lens arrays (A and B) as well as the cylindrical lens (C) are each shaped as a monolith and preferably with aspherical form.

FIG. 5 shows a perspective view of collimation optics in a second embodiment. One notes how the cylindrical-lens arrays (A and B) are each shaped as monoliths. The cylindrical-lens surface (C) for fast-axis collimation (y-direction) is formed integrally on the backside of the cylindrical-lens array (A).

Other embodiments can allow the cylindrical-lens arrays (A and B) to be formed as one monolithic optical component and provide a separate cylindrical lens or cylindrical-lens array for fast-axis collimation.

The mode of operation has already been further explained above.

In FIG. 6, an alternative design of the invention is presented in which the arrays (A and B) form a biconvex-lens system. The array (A) thereby constitutes the Fourier transformer while the array (B) represents the field lens. The separation of the two arrays (A and B) corresponds to the principal plane distance (T) of the biconvex-lens arrangement where $T=nF_A$, with $n=1$ for air. For the resultant focal length ($F_1$) of the biconvex-lens arrangement, $F_1=F_A$ applies. With the flexibly determined separation ($z_1$) between the emitters (E) and the array (A), the focal length ($F_B$) obeys the relationship:

$$\frac{1}{F_B} = \frac{1}{F_A} - \frac{z_1}{F_A^2}.$$

Figure 7B:
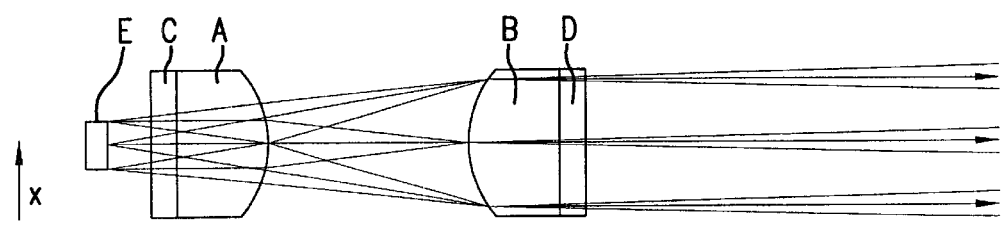

FIG. 7 shows a schematic representation of a complete collimation device according to the invention for the x-direction (slow-axis) and the y-direction (fast-axis). FIG. 7a shows the collimation of the fast-axis (y-direction). FIG. 7b shows the collimation of the slow-axis (x-direction). In particular for small emitters (E) and narrow separations ($P_x$), an overlapping of the emitter beams in the slow-axis direction can already occur within the optics for collimation of the fast-axis. In the embodiment shown, this problem is solved by having the divergence along the fast-axis direction first reduced by the cylindrical lens (C) and the slow-axis divergence collimated in the second step by the lens combination (A, B) described in FIG. 6. In the next step, the residual divergence along the fast-axis is reduced by a further cylindrical lens (D). This arrangement has the particular advantage that, with the slow-axis being already collimated, the fast-axis divergence can be reduced optimally. This would not be possible without a prior slow-axis collimation.

By combining the array (A) and the cylindrical lens (C) or the array (B) and the cylindrical lens (D) into monolithic components, no more than four lens interfaces are necessary for optimal collimation of the linear emitter matrix (E). This is of course especially advantageous when taking losses into consideration.

What is claimed is:

1. An optical emitter array with collimation optics comprising:
   a number of extended emitters arranged side-by-side in an x-direction, having a specified divergence in said direction; a center-to-center separation greater than an emitter size in said x-direction in which said collimation optics include a cylindrical-lens array with a number of convergent cylindrical-lens surfaces each assigned to an emitter and having its cylindrical axis lying in a y-direction, arranged in front of said emitter array, wherein that a first cylindrical-lens array with a focal length is positioned in front of the emitters within an overlap distance at which the ray bundles emerging from said emitters overlap at a separation; and
   a second cylindrical-lens array having the same said focal length is positioned with a telescopic arrangement at a distance of said focal length away from the first said cylindrical lens array.

2. An emitter array according to claim 1, wherein said focal length is given by:

$$F_A = \frac{P_x}{2\tan\alpha_x}.$$

3. An emitter array according to claim 1, wherein said cylindrical-lens arrays have one-piece construction.

4. An emitter array according to claim 1, wherein said fast-axis collimator, further comprises a cylindrical lens whose cylindrical axis lies along the y-direction is arranged in front of said emitter array.

5. An emitter array according to claim 4, wherein said fast-axis collimator is constructed as a single piece with one of said first or second cylindrical-lens arrays.

6. An emitter array according to claim 1, wherein said cylindrical-lens surfaces are of aspherical design.

7. An emitter array according to claim 1, wherein said emitter array further comprises diode laser bars lying along the x-direction.

8. A method for collimating the beam of an emitter array in which a number of extended emitters are arranged side-by-side in an x-direction, with a specified divergence in said x-direction and a center-to-center separation greater than the emitter size in said x-direction comprising:
   means of a first cylindrical-lens array, a ray bundle of a width for each individual emitter is broadened to the center-to-center distance wherein a virtual source having a width is generated in the intermediate plane of a second cylindrical-lens array, where said first and second cylindrical-lens arrays are arranged in Fourier configuration at focal-length separation.

9. An optical emitter array with collimation optics in which a number of extended emitters are arranged side-by-side in an x-direction, with a specified divergence in said x-direction and a center-to-center separation greater than an emitter size in said x-direction in which said collimation optics comprising:
   a cylindrical lens array with a number of convergent cylindrical-lens surfaces each assigned to an emitter and having a cylindrical axis lying in a y-direction;
   said collimation optics arranged in front of said emitter array; a first cylindrical-lens array positioned in front of said emitter at a distance that is smaller than an overlap distance at which individual ray bundles emerging from said emitter overlap; and
   a second cylindrical-lens array is positioned at a distance in front of said cylindrical-lens array wherein said first and second cylindrical arrays together form a biconvex-lens arrangement with resultant focal length and a principal-plane distance.

10. An emitter array according to claim 9, wherein $F_A$, $F_B$ and $z_1$ obey the relationship, $F_A$ is a first focal length, $F_B$ is a second focal length, and $z_1$ is a distance between said emitter and said first cylindrical array:

$$\frac{1}{F_B} = \frac{1}{F_A} - \frac{z_1}{F_A^2}.$$

11. An emitter array according to claim 9, wherein said cylindrical-lens surface having a cylindrical axis lying along the x-direction arranged between said emitters and said first cylindrical-lens array.

12. An emitter array according to claim 11, wherein said first cylindrical-lens array and said cylindrical-lens surface are constructed as a monolithic component.

13. An emitter array according to claim 9, wherein a cylindrical-lens surface whose cylindrical axis lies along the x-direction is arranged between said first cylindrical-lens array and said second cylindrical-lens array.

14. An emitter array according to claim 9, wherein a cylindrical surface whose cylindrical axis lies along the x-direction is positioned on the side of said cylindrical-lens arrays opposite from said emitters so that at least a reduction of a residual fast-axis divergence is carried out after a divergence reduction for a slow-axis.

15. An emitter array according to claim 13, wherein said second cylindrical-lens array and said cylindrical-lens surface are constructed as a monolithic component.

16. An emitter array according to claim 1, wherein said first and second cylindrical-lens arrays are arranged on a monolithic component.

* * * * *